(12) United States Patent
Kluge

(10) Patent No.: US 8,496,866 B2
(45) Date of Patent: Jul. 30, 2013

(54) CHIP RESISTOR SUBSTRATE

(75) Inventor: Claus Peter Kluge, Röslau (DE)

(73) Assignee: CeramTec GmbH, Plochingen (DE)

( * ) Notice: Subject to any disclaimer, the term of this patent is extended or adjusted under 35 U.S.C. 154(b) by 331 days.

(21) Appl. No.: 12/596,887

(22) PCT Filed: Apr. 17, 2008

(86) PCT No.: PCT/EP2008/054638
§ 371 (c)(1),
(2), (4) Date: Oct. 21, 2009

(87) PCT Pub. No.: WO2008/132055
PCT Pub. Date: Nov. 6, 2008

(65) Prior Publication Data
US 2010/0221478 A1  Sep. 2, 2010

(30) Foreign Application Priority Data
Apr. 25, 2007 (DE) .................. 10 2007 019 875

(51) Int. Cl.
*B29C 71/00* (2006.01)
(52) U.S. Cl.
USPC .................. 264/482; 264/138; 264/345

(58) Field of Classification Search
USPC .......................... 264/482, 138, 345
See application file for complete search history.

(56) References Cited

U.S. PATENT DOCUMENTS

| | | | |
|---|---|---|---|
| 5,175,044 A | 12/1992 | Arasawa | |
| 5,676,855 A * | 10/1997 | Schulz-Harder | 216/52 |
| 6,327,875 B1 | 12/2001 | Allaire et al. | |
| 6,420,678 B1 * | 7/2002 | Hoekstra | 219/121.75 |
| 6,744,009 B1 * | 6/2004 | Xuan et al. | 219/121.67 |
| 2003/0006220 A1 | 1/2003 | Cummings et al. | |
| 2004/0214408 A1 * | 10/2004 | Wakayama | 438/462 |
| 2006/0145399 A1 * | 7/2006 | Weisser et al. | 264/405 |
| 2006/0183298 A1 | 8/2006 | Schulz-Harder et al. | |
| 2007/0228100 A1 * | 10/2007 | Gonoe | 225/1 |

FOREIGN PATENT DOCUMENTS

| | | |
|---|---|---|
| DE | 10327360 | 1/2005 |
| WO | WO 2006046525 A1 * | 5/2006 |

* cited by examiner

*Primary Examiner* — Galen Hauth
(74) *Attorney, Agent, or Firm* — Fulbright & Jaworski LLP

(57) ABSTRACT

A method for the targeted introduction of cleavage lines or predetermined breaking lines in ceramic substrates for subsequent separation, wherein, in a thermal treatment step or methods step, the cleavage line or predetermined breaking line is heated locally and then cooled suddenly by a coolant in such a way that targeted cracking or material weakness occurs along the cleavage line or predetermined breaking lines.

8 Claims, No Drawings

CHIP RESISTOR SUBSTRATE

This application is a §371 of PCT/EP2008/054638 filed. Apr. 17, 2008, and claims priority from DE 10 2007 019 875.4 filed Apr. 25, 2007.

FIELD OF THE INVENTION

The invention relates to a method for the targeted introduction of cleavage lines and/or predetermined breaking lines into ceramic substrates for subsequent separation. According to the method, in a thermal treatment step or method step, the cleavage line and/or predetermined breaking line to be created is first heated locally and then cooled suddenly by a coolant in such a way that targeted cracking or material weakening occurs in the ceramic substrate along the cleavage line and/or predetermined breaking line, because of this temperature change.

BACKGROUND OF HE INVENTION

Metal-ceramic substrates in the form of a multiple substrate are known, metallisations (metal areas), which are each associated with individual substrates and/or form the metallisation of individual substrates, being provided on a common ceramic plate or layer, e.g. of large area. Then, for instance, grooves forming predetermined breaking lines are introduced in the ceramic layer by lasers, so that the multiple substrate can be separated into the individual substrates along these predetermined breaking lines by mechanical breaking.

A disadvantage is that material which evaporates when the grooves which form the predetermined breaking lines are introduced is deposited back onto the substrate, causing contamination of the multiple substrate, in particular the metal areas, which can have an interfering effect on further processing.

From DE 103 27 360 A1, there is a method of producing a metal-ceramic substrate. According to this method, at least one metal area is deposited on at least one surface side of a ceramic, and after the deposition of the at least one metal area, the metal-ceramic substrate, in a thermal treatment step or method step, is heated along at least one cleavage line or predetermined breaking line, and then cooled suddenly by a coolant in such a way that targeted cracking or material weakening occurs in the metal-ceramic substrate along the cleavage line or predetermined breaking line, because of this temperature change.

OBJECTS AND SUMMARY OF THE INVENTION

The invention is based on the object of improving a method for the targeted introduction of cleavage lines and/or predetermined breaking lines into ceramic substrates for subsequent separation, so that the material which evaporates when the cleavage lines and/or predetermined breaking lines are introduced is not deposited on the multiple substrate. in particular not on its metalized areas or metal areas, so that contamination of the multiple substrate or its metal areas occurs, which would have an interfering effect on further processing. Additionally, a ceramic substrate produced according to this method, and a preferred use, are described.

According to the invention, this object regarding the method is achieved by the present invention described herein.

DETAILED DESCRIPTION

Because the cleavage lines and/or predetermined breaking lines are introduced into the surface of the fully sintered ceramic substrate, i.e. before the deposition of the metallised areas or metal areas, no material which evaporates when the cleavage lines and/or predetermined breaking lines are introduced can be deposited on the multiple layer, in particular not on its metallised areas or metal areas, and thus cause contamination of the multiple substrate or its metal areas.

In this method, wherein either the ceramic layer is thermally cleaved or split along the processing line or cleavage line by the thermal treatment, or at least one predetermined breaking line in each case is generated by the thermal treatment, and makes later cleavage of the ceramic by mechanical breaking possible, no contamination of the substrate occurs, and in particular no formation of edges or funnels by deposition of evaporated material on the substrate along the cleavage line and/or predetermined breaking line, so that further processing of the substrate is not affected.

In an inventive version, a three-dimensional structure is used for the ceramic substrate. In this way a suitable geometry can be produced for any application.

Another inventive version is characterized in that a plane structure is used for the ceramic substrate, preferably with lengths and widths of 1 to 30 cm and thicknesses less than 2 mm. With these measurements in particular, high-quality ceramic substrates can be achieved.

Preferably, the energy supply during the thermal treatment step or method step is controlled so that the cleavage lines and/or predetermined breaking lines have the same or different crack depths. By choosing the crack depth, the required breaking force for breaking off can be set in a targeted manner.

In a further development of the invention, the cleavage lines and/or predetermined breaking lines are introduced on at least two sides of the ceramic substrate. For instance, the cleavage lines and/or predetermined breaking lines can be opposite each other on two sides of the ceramic substrate, so that breaking off from two sides is possible or made easier.

In a further development of the invention, the energy supply during the thermal treatment step or method step is controlled so that the cleavage lines and/or predetermined breaking lines do not run continuously from edge to edge of the ceramic substrate, but have interruptions in a targeted manner. This improves the resistance of the ceramic substrate to breaking off.

In a version of the invention, for the ceramic substrate, rods, e.g. with cylindrical or rectangular or polygonal structure, or profiles, e.g. with U or H or L shape, are used. Thus, depending on the type of application, any three-dimensional ceramic substrates can be produced.

Preferably, the energy supply during the thermal treatment step or method step is controlled so that the cleavage lines and/or predetermined breaking lines are almost invisible to the human eye, and no deformation of the surface and contamination along the cleavage line or predetermined breaking line can be detected. In this way the outer appearance of the ceramic substrate is flawless, without visible cleavage lines and/or predetermined breaking lines.

The ceramic substrate according to the invention is a ceramic which is fully sintered on its whole surface, and on the surface of which cleavage lines and/or predetermined breaking lines are arranged for separation.

Preferably, the ceramic substrate has a three-dimensional structure, so that the ceramic substrate can be adapted to all types of application.

In an inventive version, the cleavage lines and/or predetermined breaking lines have the same or different crack depth, so that the required breaking force for breaking off can be set in a targeted manner.

In a version of the invention, the cleavage lines and/or predetermined breaking lines are arranged on multiple sides of the ceramic substrate. Thus the ceramic substrate can be separated at all conceivable positions.

In another embodiment, the cleavage lines and/or predetermined breaking lines do not run continuously from edge to edge of the ceramic substrate, but have interruptions in a targeted manner. In this way the separation can also be improved.

In a version, the ceramic substrate has the form of rods, e.g. with cylindrical or rectangular or polygonal structure, or profiles, e.g. with U or H or L shape. The ceramic substrate can thus be produced in all advantageous geometries.

It should also be emphasised that the cleavage lines and/or predetermined breaking lines can also consist of multiple cleavage positions or predetermined breaking positions which are arranged one behind the other, and thus form a cleavage line or predetermined breaking line. If the cleavage lines and/or predetermined breaking lines are introduced using a laser, they always consist of multiple holes, which in their totality form a "line".

In an inventive version, the cleavage lines and/or predetermined breaking lines are almost invisible to the human eye, and no deformation of the surface and contamination along the cleavage line or predetermined breaking line can be detected.

A preferred ceramic substrate is characterized in that onto the ceramic substrate, which is provided with cleavage lines and/or predetermined breaking lines, suitable material areas and/or elements which define a resistance and consist of at least one component are deposited, and individual parts and/or part groups result from breaking off along the cleavage lines and/or predetermined breaking lines, and yield chip resistors in downstream procedures.

In a preferred use of a ceramic substrate to produce a chip resistor substrate, onto the ceramic substrate, which is provided with cleavage lines and/or predetermined breaking lines, suitable material areas and/or elements which define a resistance and consist of at least one component are deposited, and individual or multiple combined parts and/or part groups result from breaking off along the cleavage lines and/or predetermined breaking lines, and yield chip resistors in downstream procedures.

The thus produced parts and/or part groups, which can be processed into chip resistors in downstream procedures, are characterized by a fault-free surface and/or almost smooth breaking edges.

In one embodiment, on the ceramic substrate, on at least one side, at least one predetermined breaking line and/or perforation has been introduced in the unsintered state by material displacement, e.g. punching or stamping or pressing.

In another embodiment, on the ceramic substrate, on at least one side, in the sintered state, at least one predetermined breaking line and/or perforation has been introduced, e.g. by laser drilling or laser scribing or water jet cutting or drilling.

The predetermined breaking line and/or perforation can be introduced by the stated methods in both the unsintered and the sintered state.

It is claimed:

1. A method for targeted introduction of cleavage lines or predetermined breaking lines into a ceramic substrate for subsequent separation, comprising the steps of locally heating the cleavage lines or predetermined breaking lines to be created to form a locally heated region; and subsequently suddenly cooling the locally heated region with a coolant in such a way that targeted cracking or material weakening occurs in the ceramic substrate along the cleavage lines or predetermined breaking lines, because of this temperature change, wherein the cleavage lines or predetermined breaking lines are introduced into the surface of a fully sintered ceramic substrate; and subsequently depositing metalized or metal areas on the surface of the substrate, wherein energy supply during the thermal treatment step is controlled so that the cleavage lines or predetermined breaking lines do not run continuously along the ceramic substrate, but have interruptions in a targeted manner.

2. A method according to claim 1, where a three-dimensional structure is used for the ceramic substrate.

3. A method according to claim 1, wherein a plane structure is used for the ceramic substrate, preferably with lengths and widths of 1 to 30 cm and thicknesses less than 2 mm.

4. A method according to claim 1, wherein the energy supply during the thermal treatment step or method step is controlled so that the cleavage lines or predetermined breaking lines have the same or different crack depths.

5. A method according to claim 1, wherein the cleavage lines or predetermined breaking lines are introduced on at least two sides of the ceramic substrate.

6. A method according to claim 1, wherein the ceramic substrate is a rod having a cylindrical, rectangular or polygonal structure.

7. A method according to claim 1, wherein the energy supply during the thermal treatment step or method step is controlled so that the cleavage lines or predetermined breaking lines are invisible to the human eye, and no deformation of the surface and contamination along the cleavage lines or predetermined breaking lines can be detected.

8. A method according to claim 1, wherein the ceramic substrate is in the shape of a U, an L or an H.

* * * * *